United States Patent
Pekny et al.

(10) Patent No.: US 6,826,096 B2
(45) Date of Patent: Nov. 30, 2004

(54) MULTIPLE VOLTAGE SUPPLY SWITCH

(75) Inventors: Theodore T. Pekny, Campbell, CA (US); Steve J Gualandri, Campbell, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/429,373

(22) Filed: May 5, 2003

(65) Prior Publication Data

US 2003/0202400 A1 Oct. 30, 2003

Related U.S. Application Data

(62) Division of application No. 09/773,284, filed on Jan. 31, 2001, now Pat. No. 6,563,339.

(51) Int. Cl.[7] ............................................. G11C 7/00
(52) U.S. Cl. .................... 365/189.09; 365/226
(58) Field of Search ............... 365/189.09, 189.11, 365/226, 185.11

(56) References Cited

U.S. PATENT DOCUMENTS

| | | | |
|---|---|---|---|
| 5,239,510 A | * 8/1993 | Hill | 365/226 |
| 5,644,531 A | * 7/1997 | Kuo et al. | 365/185.11 |
| 5,701,072 A | 12/1997 | Jeon et al. | 326/33 |
| 5,747,979 A | 5/1998 | Nagai | 326/80 |
| 5,757,714 A | * 5/1998 | Choi et al. | 365/226 |
| 5,811,991 A | 9/1998 | Takashima | 326/33 |
| 6,049,498 A | * 4/2000 | Chen | 365/226 |
| 6,356,498 B1 | * 3/2002 | Keeth | 365/226 |
| 6,377,106 B1 | 4/2002 | Rozsypal | 326/80 |

* cited by examiner

*Primary Examiner*—Trong Phan
(74) *Attorney, Agent, or Firm*—Schwegman, Lundberg, Woessner & Kluth, P.A.

(57) ABSTRACT

A multiple voltage supply switch is disclosed. The multiple voltage supply switch includes a plurality of switching device pairs. Each switching device pair is connectable between an associated one of a plurality of voltage supplies and an output of the switch. Each switching device pair includes a first switching device connected to the associated one of the plurality of voltage supplies and a second switching device connected in series between the first switching device and the output of the switch. Both the first and second switching devices are activated to connect the associated one of the voltage supplies to the output of the switch and at least one of the first or the second switching devices of each of the other switching device pairs are inactivated to disconnect the voltage supply associated with the other switching device pairs from the output of the switch.

14 Claims, 7 Drawing Sheets

| IN1 | IN2 | Vout | TV1 | TV1_ | NN1 | TV2 | TV2_ | NN2 | TV3 | TV3_ | NN3 |
|---|---|---|---|---|---|---|---|---|---|---|---|
| 0 | x | V1 | GND | TV1 | 1 | TV2 | GND | 0 | TV3 | GND | 0 |
| 1 | 0 | V2 | TV1 | GND | 0 | GND | TV2 | 1 | TV3 | GND | 0 |
| 1 | 1 | V3 | TV1 | GND | 0 | TV2 | GND | 0 | GND | TV3 | 1 |

MULTIPLE VOLTAGE SUPPLY SWITCH

This application is a divisional of U.S. application Ser. No. 09/773,284 filed on Jan. 31, 2001, now U.S. Pat. No. 6,563,339, which is incorporated herein by reference.

FIELD OF THE INVENTION

The present invention relates generally to electronic circuits, and more particularly to a multiple voltage supply switch to selectively apply one of a plurality of voltage supplies to an output.

BACKGROUND INFORMATION

Often in integrated circuit design, one or more of the components of an integrated circuit or system will need to be powered by different voltages or the circuit or system will perform different functions depending upon the voltage applied to the component. For example, the cells of a memory array or system will perform different functions or can be placed in different modes of operation depending upon the voltage level applied to the gates of passgate transistors controlling the operation of the memory cells or devices in the array. To place selected memory cells in a programming mode, a high voltage may be applied to the gate of the passgate transistor controlling the selected memory cells. A second, different voltage level may be applied to the gate of the passgate transistor during an erase verify operation and a third voltage level may be applied to the gate of the passgate transistor for a normal read operation of the memory cells. A need therefore exists to multiplex a plurality of analog voltage supplies onto a common bus to control the operation of memory cells in a memory system or to connect to components operating at various voltage levels.

One known arrangement for multiplexing three different voltage supplies onto a common bus is to use two two-way analog switches connected in series. Two of the voltage supplies, V1 and V2, would be connected to inputs of the first analog switch. The output of the first analog switch would be connected to one input of the second analog switch and the third voltage supply, V3, would be connected to another input of the second analog switch. The first analog switch can then be operated to connect either V1 or V2 to the input of the second analog switch. The second analog switch can then be operated to connect the output of the first analog switch (V1 or V2) or V3 to its output.

A switch leg or path through a two-way analog switch typically includes at least two p-channel devices or field effect transistors in series between the voltage supply and the output of the switch. Therefore, for the arrangement described above, V1 or V2 would be connected through at least four p-channel devices to be connected to the output of the second two-way analog switch. Each of the p-channel devices introduces some amount of IR drop or voltage drop (voltage=current (I)×resistance (R)) which may adversely affect the performance of this switching arrangement for use in high current applications.

Accordingly, for the reason stated above, and for other reasons that will become apparent upon reading and understanding the present specification, there is a need for a multiple voltage supply switch that has minimal IP drop between the input and the output of the switch and that exhibits good performance characteristics for high current applications.

SUMMARY OF THE INVENTION

In accordance with the present invention, a multiple voltage supply switch includes a plurality of switching device pairs. Each switching device pair is connectable between an associated one of a plurality of voltage supplies and an output of the switch. Each switching device pair includes a first switching device connected to the associated one of the plurality of voltage supplies and a second switching device connected in series between the first switching device and the output of the switch. Both the first and second switching devices are activated to connect the associated one of the voltage supplies to the output of the switch and at least one of the first or the second switching devices of each of the other switching device pairs is inactivated to disconnect the voltage supply associated with each of the other switching device pairs from the output of the switch.

In accordance with another aspect of the present invention, a system includes a multiplex voltage supply switch and a plurality of voltage supplies connected to the multiplex voltage supply switch. The system further includes at least one device operating on voltages of different levels that is connected to an output of the multiplex supply switch. The multiplex switch alternatively applies a selected one of the plurality of voltage supplies to the at least one device to cause the device to perform different predetermined operations in response to the level of the voltage supply applied. The system may include a control circuit to select the voltage supply to be applied to the device according to the desired function or operation to be performed. The control circuit may be controlled by an algorithm. The multiplex switch includes a plurality of switch paths, one switch path between each of the plurality of voltage supplies and an output of the multiplex switch. Each switch path includes only two switching devices to minimize an IR drop across the switch path.

In accordance with a further aspect of the present invention, a method of alternatively applying one of a plurality of voltage supplies to a device, in response to an operation or function to be performed by the device, includes connecting each of a plurality of voltage supplies to one of a plurality switching device pairs of a multiplex switch; selecting one of the plurality of voltage supplies to be connected to an output of the multiplex switch by activating a first switching device and a second switching device of the switching device pair associated with the one of the plurality of voltage supplies; and selectively inactivating at least one of a first or a second switching device of each of the other switching device pairs to disconnect an associated one of the plurality voltage supplies not selected to be connected to the output of the multiplex switch.

BRIEF DESCRIPTION OF THE DRAWINGS

In the drawings like reference numerals describe substantially similar components throughout the several views. Like numerals having different letter suffixes represent different instances of substantially similar components.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims.

Figure 1:
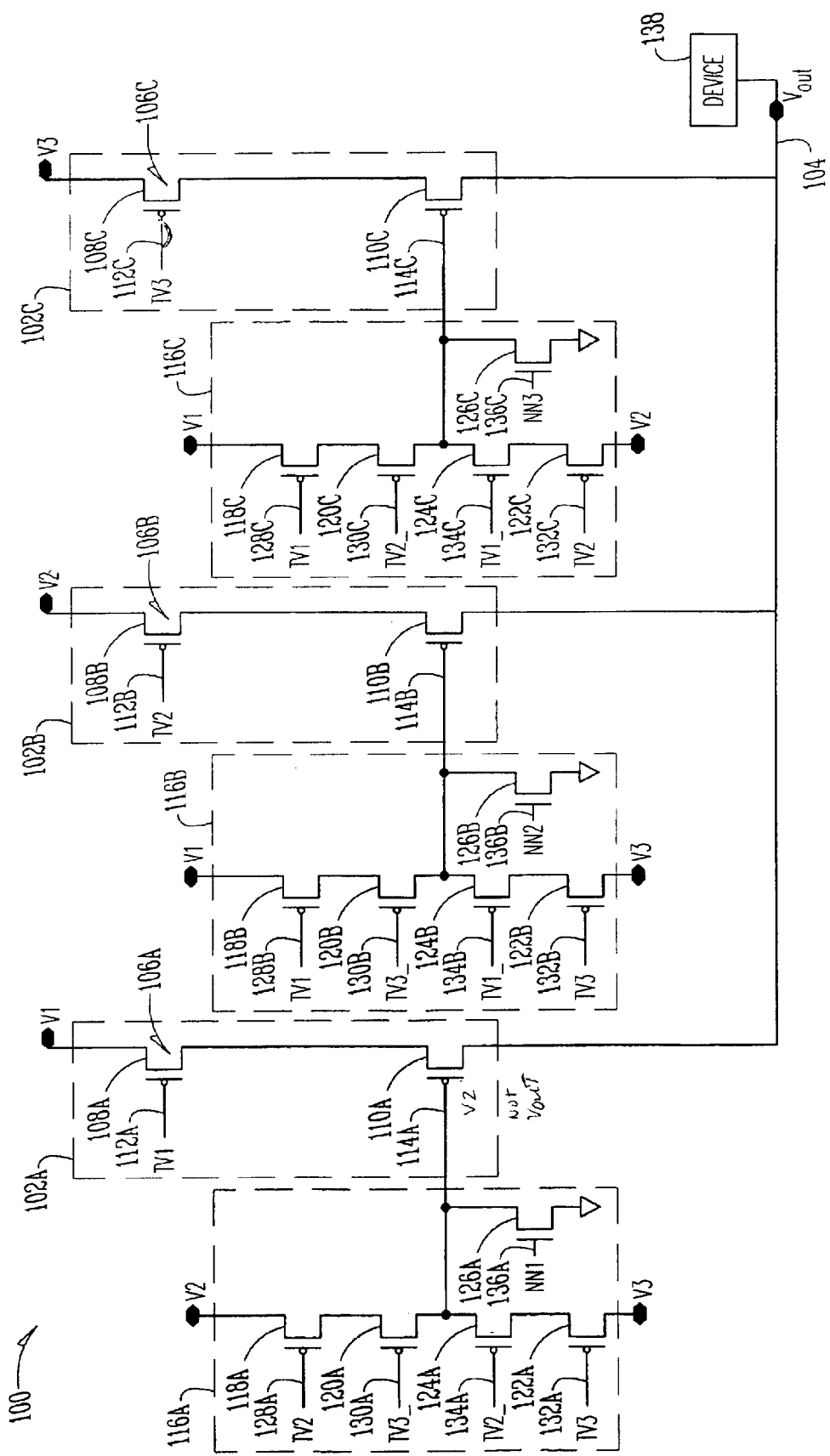
FIG. 1 is a schematic diagram of a multiple voltage supply switch in accordance with the present invention.

FIG. 1 is a schematic diagram of one example of a multiple voltage supply switch 100 or voltage multiplexer in accordance with the present invention. The switch 100 includes a plurality of switch paths or circuits 102A, 102B and 102C. The switch path 102A, 102B, and 102C are connectable between associated voltage supplies, V1, V2 or V3, respectively, and an output 104 (Vout) of the switch 100. The output 104 is shown connected to device 138. Switch paths 102A, 102B, 102C preferably include only a pair of switching devices 106A, 106B, and 106C, respectively, to minimize the IR drop across each of the switch paths or circuits 102A, 102B, 103G. Accordingly, pairs of switching devices 106A, 106B, and 106C include first switching devices 108A, 108B, 108G, respectively, connectable to associated voltage supplies V1, V2 or V3 and second switching devices 110A, 110B, and, 110G connected between the first switching devices 108A, 108B, and 108G, respectively, and the output 104 of the switch 100. For the example shown in FIG. 1, the first and second switching devices 108A, 108B, 108C, 110A, 110B, and 110G are p-channel (pch) devices or field effect transistors (PETs) or the like. N-channel (nch) devices or FETs could be used as well with the nch transistors being activated by a high voltage applied to their respective gate terminals rather than a low voltage or ground for pch transistors.

Accordingly, the first pair of switching devices 106A defining the first switch path 102A includes a first pch transistor 108A connectable to an associated first voltage supply V1 and a second pch transistor 110A connected between the first pch transistor 108A and the output 104 of the switch 100. The second pair of switching devices 106B defining the second switch path 102B includes a first pch transistor 108B connectable to an associated second voltage supply V2 and a second pch transistor 110B connected between the first pch transistor 108B and the output 104 of the switch 100. Similarly, the third pair of switching devices 106C defining the third switch path 102C includes a first pch transistor 108C connectable to an associated third voltage supply V3 and a second pch transistor 110C connected between the first pch transistor 108C and the output 104 of the switch 100.

In operation, when one of the voltage supplies, V1, V2 or V3 is selected to be connected to the output 104 of the switch 100, the first pch transistor 108A, 108B or 108C and the second pch transistor 110A, 110B or 110C associated with the selected voltage supply V1, V2 or V3 are selectively activated or the electronic switches are closed by connecting their respective gates to ground to form an electrical circuit connecting the selected voltage supply V1, V2 or V3 to the output 104 of the switch 100. At least one of the first pch transistors 108A, 108B or 108C or the second pch transistors 110A, 110B or 110C associated with each of the voltage supplies V1, V2, or V3 not selected to be connected to the output 104 are selectively inactivated or turned off by connecting their respective gates to a high signal to disconnect the non-selected voltage supplies V1, V2 or V3 from the output 104 of the switch 100. For example if V1 in FIG. 1 is selected to be connected to the output 104, a gate 112A of first pch transistor 108A and a gate 114A of the second pch transistor 110A will be connected to ground, as described in more detail below. The transistors 108A and 110A are, therefore, activated or turned on to connect the voltage supply V1 to the output 104. At the same time, a predetermined high voltage will be applied to at least one of the gates 112B and 114B to inactivate or turn off at least one of pch transistors 108B and 110B of switch path 102B to disconnect V2 from the output 104 while V1 is connected to the output 104. A predetermined high voltage will also be applied to at least one of the gates 112C and 114C to inactivate or turn off at least one of the pch transistors 108C and 110C of the switch path 102C to disconnect V3 from the output 104 when V1 is connected to the output 104 of the switch 100.

The switch 100 further includes a plurality of input circuits 116A, 116B and 116C. One of the plurality of input circuits 116A–C is connected to the gate 114A–C of each second pch transistors 110A–C to connect the gate 114A–C to ground to activate the particular second transistor 110A–C if the associated voltage supply V1, V2 or V3 has been selected to be connected to the output 104, or to connect the gate 114A–C to one of two predetermined high voltage levels if the associated voltage supply V1, V2 or V3 is to be disconnected from the output 104 of the switch 100. A first input circuit 116A includes a first input pch transistor 118A connectable to the second voltage supply V2 and a second input pch transistor 120A connected between the first input pch transistor 118A and the gate 114A of the second transistor 110A. The first input circuit 116A also includes a third input pch transistor 122A connectable to the third voltage supply V3 and a fourth input pch transistor 124A connected between the third input pch transistor 122A and the gate 114A of the second transistor 110A. The first input circuit 116A further includes a fifth input N-channel (nch) transistor 126A connected between the gate 114A and ground.

As shown in FIG. 1, a second input circuit 116B and a third input circuit 116C have basically identical circuits to the first input circuit 116A except they are connectable to different voltage supplies V1, V2 or V3. In the second input circuit 116B, the first input transistor 118B is connectable to the first voltage supply V1 and the third input transistor 122B is connectable to the third voltage supply V3. In the third input circuit 116C, the first input pch transistor 118C is connectable to the first voltage supply V1 and the third input pch transistor 122C is connectable to the second voltage supply V2.

In explaining the operation of the input circuits 116A–C, assume V1 is selected to be connected to the output 104 of the switch 100. The gate 112A of the first transistor 108A will be connected to ground (TV1), as described in more detail below with respect to FIG. 2, to activate the first transistor 108A and connect the associated voltage supply V1 to the second transistor 110A. A gate 128A of the first input transistor 118A, a gate 130A of the second input transistor 120A, a gate 132A of the third input transistor 122A and a gate 134A of the fourth input transistor 124A are all connected to a predetermined high voltage level as described in more detail below to inactivate or turn off the input transistors 118A, 120A, 122A and 124A. A gate 136A of the fifth input nch transistor 126A is also connected to a predetermined high voltage level (NN1) to activate the fifth input transistor 126A to connect the gate 114A of the second transistor 110A to ground. Accordingly, the second transistor 110A of the first switch path 102A is also activated to connect the first voltage supply V1 to the output 104 of the switch 100.

In the second switch path or circuit 102B, the gate 112B of the first transistor 108B is connected to a predetermined high voltage level that is a translation of the second voltage supply V2 (TV2). In the second input circuit 116B the gate 128B of the first input transistor 118B is connected to ground (TV1) to activate the first input transistor 118B and the gate 130B of the second input transistor 120B is also connected to ground (TV3_) to activate the second input transistor 120B. Accordingly, the first input transistor 118B and the second input transistor 120B are activated to connect the first supply voltage V1 to the gate 114B of the second transistor 110B to inactivate the second transistor 110B and disconnect V2 from the output 104 of the switch 100 when the first voltage supply V1 is connected to the output 104. A high voltage level will be applied to the gates 132B and 134B to inactivate transistors 122B and 124B and a low voltage or ground will be applied to the gate 136B to inactivate the fifth nch transistor 126B.

Similarly, a predetermined high voltage that is a translation of the third voltage supply V3 (TV3) will be applied to the gate 112C of the first transistor 108C of the third switch path 102C to inactivate the first transistor 108C to disconnect the third voltage supply V3 from the output 104. The input transistors 118C and 120C will be activated by connecting their respective gates 128C and 130C to ground to connect the first voltage supply V1 to the gate 114C of the second transistor 110C to inactivate the second transistor 110C of the third switch path 102C to further disconnect the third voltage supply V3 from the output 104 of the switch 100.

Accordingly, one of the input circuits 116 will apply ground to the gate 114 of the associated second transistor 110 when the associated voltage supply V1, V2, or V3 is selected to be connected to the output 104 of the switch 100, and the other input circuits 116 will apply the selected voltage supply V1, V2 or V3 to the gates 114 of the other associated second transistors 110. When V1 is selected to be connected to the output 104, V1 is also connected to the gates 114B and 114C of the second transistors 110B and 110C by their respective input circuits 116B and 116C to inactivate the second transistors 110B and 110C to disconnect the second and third voltage supplies V2 and V3 from the output 104. Similarly, when V2 is selected to be connected to the output 104 of the switch 100, V2 is also connected to the gates 114A and 114C of the respective second transistors 110A and 110C by the input circuits 116A and 116C to inactivate the second transistors 110A and 110C and disconnect the voltage supplies V1 and V3 from the switch output 104. Likewise, when V3 is selected to be connected to the output 104, V3 is also connected to the gates 114A and 114B of the second transistors 110A and 110B by the input circuits 116A and 116B to inactivate the second transistors 110A and 110B to disconnect the voltage supplies V1 and V2 from the switch output 104.

While the multiple voltage supply switch 100 has been described using P-channel transistors for all switching devices except N-channel transistors for switching devices 126A, 126B and 126C, it should be noted that N-channel transistors may be substituted for the P-channel transistors and P-channel transistors substituted for switching devices 126A, 126B and 126C with the polarity or level of the gate voltages reversed relative to that described above to activate and inactive the transistors.

Figures 2, 3:
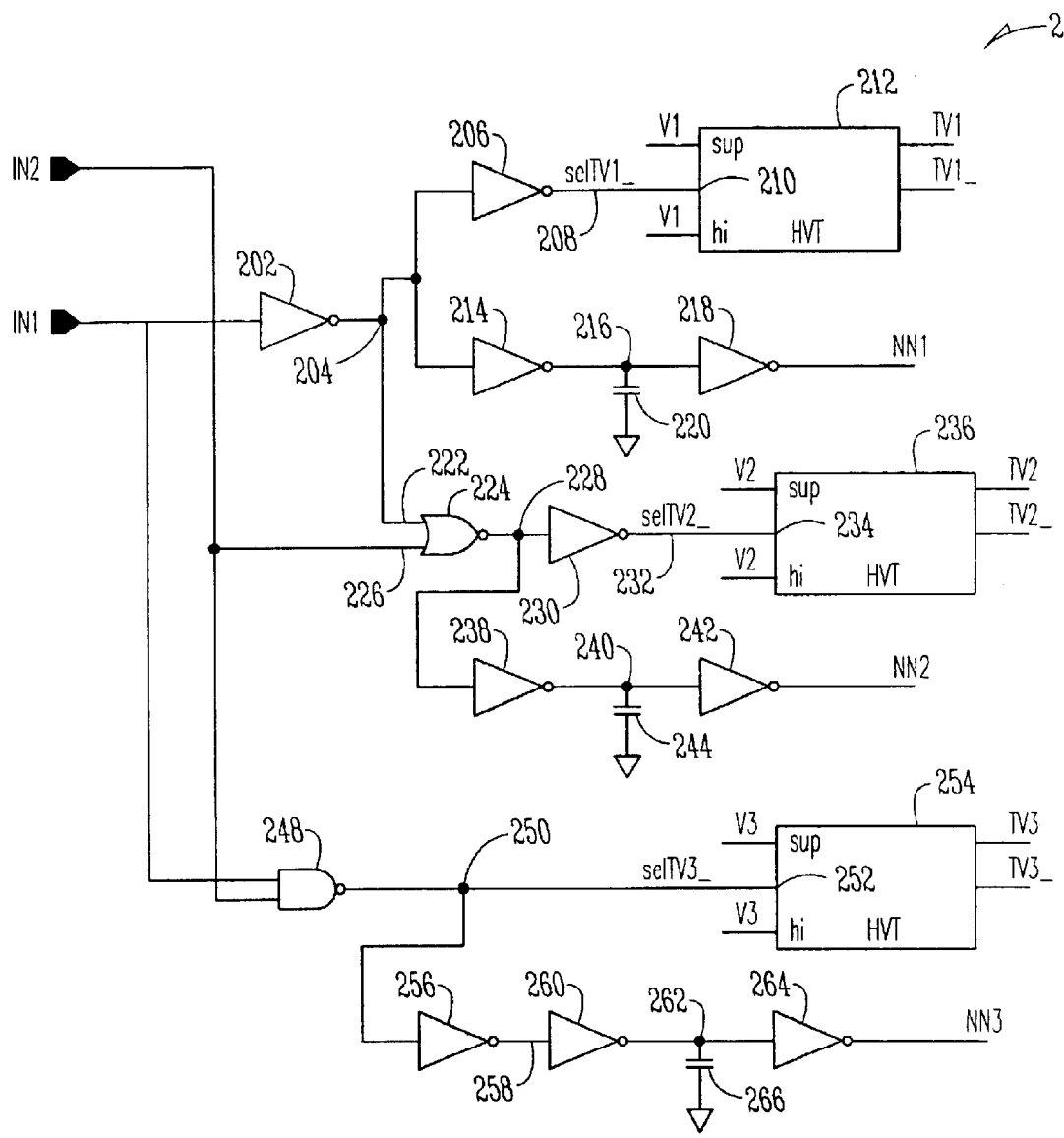
FIG. 2 is a schematic diagram of a control circuit for the multiple voltage supply switch of FIG. 1.
FIG. 3 is a state diagram showing the voltage and logic levels of the outputs of the control circuit and the multiple voltage switch for different input states of the control circuit.

FIG. 2 is a schematic diagram of a control circuit 200 for controlling the operation of the switch 100. The control circuit 200 has a first input IN1 and a second input IN2. IN1 is connected to a first inverter 202. An output 204 of the first inverter 202 is connected to a second inverter 206 and an output 208 of the second inverter 206 is connected to a logic input 210 of a first high voltage translator (HVT) 212. The first voltage supply V1 is connected to the analog inputs, "sup" and "hi," of the first HVT 212. The first HVT 212 has a translated first voltage supply output (TV1) and a complementary translated first voltage supply output (TV1_). Accordingly, if an input signal selTV1 to the first HVT 212 is a logic 0 on input 210, the TV1 output signal will be ground and the TV1_ output signal will be a translation of the first voltage supply V1. If the input signal selTV1 is a logic 1 on the input 210, the TV1 output signal will be the translation of the first voltage supply V1 and the TV1_ output signal will be ground. The translation of the first voltage supply V1 may be the first voltage supply adjusted in level by the first HVT 212.

The output TV1 is connected to the gate 112A of the first transistor 108A, the gate 128B of the first input transistor 128B of the second input circuit 116B and the gate 128C of the first transistor 128C of the third input circuit 116C. The complementary output TV1_ is connected to the gates 134B and 134C of the switch 100.

The output 204 of the first inverter 202 is also connected to a third inverter 214. An output 216 of the third inverter 214 is connected to a fourth inverter 218. The output 216 of the third inverter 214 is also coupled to ground via a capacitor 220 to filter any noise from the logic signal. The fourth inverter 218 has an output NN1 that is connected to the gate 136A of the fifth nch input transistor 126A of the first input circuit 116A.

The output 204 of the first inverter 202 is also connected to one input 222 of a NOR gate 224 and the second input IN2 is connected to another input 226 of the NOR gate 224. An output 228 of the NOR gate 224 is connected to a fifth inverter 230 and an output 232 of the fifth inverter 230 is connected to a logic input 234 of a second HVT 236. The second voltage supply V2 is connected to the analog inputs "sup" and "hi" of the second HVT 236. The second HVT 236 has a translated second voltage supply output (TV2) and a complementary translated second voltage supply output (TV2_). Accordingly, if an input signal selTV2 to the second HVT 236 is a logic 0 on input 234, the TV2 output signal will be ground and the TV2_ output signal will be a translation of the second voltage supply V2. If the input signal selTV2 is a logic 1 on the input 234, the TV2 output signal will be a translation of the second voltage supply V2 and the TV2_ output signal will be ground. The translation of the second voltage supply V2 may be the second voltage supply adjusted in level by the second HVT 236.

The output TV2 is connected to gates 112B, 128A and 132C of the switch 100 to control the operation of the corresponding pch transistors. The output TV2_ is connected to the gates 134A and 130C of switch 100 to control operation of the corresponding pch transistors.

The output 228 of the NOR gate 224 is also connected to a sixth inverter 238. An output 240 of the sixth inverter 238 is connected to a seventh inverter 242. An output NN2 of the seventh inverter 242 is connected to the gate 136B of the fifth nch input transistor 126B to control operation of the fifth nch transistor 126B. The output 240 of the sixth inverter 238 is also coupled to ground by a capacitor 244 to filter any noise in the signal.

The first input IN1 and the second input IN2 of the control circuit 200 are also each connected to inputs of a NAND gate 248. An output 250 of the NAND gate 248 is connected to a logic input 252 of a third HVT 254. The third voltage supply V3 is connected to analog inputs "sup" and "hi" of the third HVT 254. Accordingly, when a signal (selTV3) is a logic 0 on input 252, an output TV3 of the third HVT 254 is ground and the complementary output TV3_ is a translation of the third voltage supply V3. The output TV3 is connected to gates 112C, 132A, and 132B to control operation of the corresponding pch transistors. The output TV3_ is connected to gates 130A and 130B to control the operation of the corresponding pch transistors.

The output 250 of the NAND gate 248 is also connected to an eighth inverter 256. An output 258 of the eighth inverter 256 is connected to a ninth inverter 260 and an output 262 of the ninth inverter 260 is connected to a tenth inverter 264. An output NN3 of the ninth inverter 264 is connected to the gate 136C of the fifth nch input transistor 126C to control operation of the fifth nch input transistor 126C. The output 262 of the ninth inverter 260 is also connected to ground by a third capacitor 266 to filter noise from the circuit 200.

FIG. 3 is a state diagram showing the voltage and logic levels at the outputs of the control circuit 200 and multiple voltage supply switch 100 for the different input states of IN1 and IN2 and will be used to explain the operation of the control circuit 200 and the switch 100. The first supply voltage V1 is selected to be connected to the output 104 (Vout) of the switch 100 in response to the input signal IN1 being a logic 0 and the second input signal IN2 being a don't care state (x), either a logic 0 or 1. In following the IN1 logic signal through the control circuit 200, the TV1 output signal of the control circuit 200 will be ground and is applied to the gate 112A of the first transistor 108A to activate or turn on the transistor 108A of the switch 100 to connect the first supply voltage V1 to the second transistor 110A. The complementary TV1_ output signal will be a positive voltage level that is a translation of the first voltage supply V1 (TV1). The positive output voltage level TV1_ signal is applied to the gates 134B and 134C to inactivate or turn off the transistors 124B and 134C. The NN1 output signal will be a logic 1 or high in response to IN1 being a logic 0 and will cause the nch input transistor 126A to be activated to ground the gate 114A and activate the second transistor 110A to connect the first supply voltage V1 to the output 104 of the switch 100. The TV2 output signal will be a positive voltage level signal that is a translation of the second voltage supply V2 (TV2). The TV2 positive output voltage signal will be applied to the gate 112B to inactivate or turn off the first transistor 108B to disconnect the second supply voltage V2 from the switch output 104 when the first supply voltage V1 is connected to the switch output 104. Similarly, the TV3 output signal will be a positive voltage level signal that is a translation of the third voltage supply V3 (TV3). The TV3 positive output voltage signal will be applied to the gate 112C to inactivate or turn off the first transistor 108C to disconnect the third supply voltage V3 from the switch output 104 when the first supply voltage V1 is selected to be connected to the switch output 104. The TV1, TV2_ and TV3_ output signals will all be ground. The TV1 and TV3_ ground signals will be applied to the gates 128B and 130B, respectively, and the TV1 and TV2_ ground signals will be applied to the gates 128C and 130C, respectively, to activate the corresponding transistors so that the first voltage supply V1 will be applied to the gates 114B and 114C of the transistors 110B and 110C to inactivate the transistors 110B and 110C to further disconnect the second voltage supply V2 and third voltage supply V3 form the output 104 of the switch 100 when the first voltage supply V1 is selected to be connected to the output 104.

The second voltage supply V2 is selected to be connected to the output 104 of the switch 100 in response to the first input signal IN1 being a logic 1 and the second input signal IN2 being a logic 0. Following the logic signals IN1 and IN2 through the control circuit 200, the TV2 output signal of the second HVT 236 will be ground and is applied to gate 112B of the first transistor 108B of the second switch path 102B to activate or turn on the second transistor 108B to connect the second supply voltage V2 to the second transistor 110B of the second switch path 102B. The complementary TV2_ output signal will be a positive voltage level that is a translation of the second voltage supply V2 (TV2). The positive output voltage level TV2_ signal will be applied to the gates 134A and 130C to inactivate or turn off the transistors 124A and 120C. The NN2 output signal will be a logic 1 or high in response to IN1 being a logic 1 and IN2 being a logic 0 and will cause the nch transistor 126B to be activated to ground the gate 114B and activate the second transistor 110B and connect the second supply voltage V2 to the output 104 of the switch 100. The TV1_, TV2 and TV3_ output signals of the control circuit 200 will all be ground. The TV2 and TV3_ ground signals will be applied to the gates 128A and 130A, respectively and the TV2 and TV1_ ground signals will be applied to gates 132C and 134C, respectively, to activate the corresponding transistors so that the second voltage supply V2 is connected to the gates 114A and 114C of the transistors 110A and 110C to inactivate the transistors 110A and 110C to disconnect the first voltage supply V1 and the third voltage supply V3 from the output 104 of the switch 100. TV1 and TV3 will be high or positive level voltage signals to inactivate the transistors 108A and 108C to further insure that the voltage supplies V1 and V3 are not connected to the switch output 104 when the second supply voltage V2 is selected to be connected to the output 104 of the switch 100.

The third voltage supply V3 is selected to be connected to the output 104 of the switch 100 in response to the first input signal IN1 being a logic 1 and the second input signal IN2 also being a logic 1. Following the logic signals IN1 and IN2 through the control circuit 200, the TV3 output signal of the third HVT 254 will be ground and is applied to gate 112C of the first transistor 108C of the third switch path 102C to activate or turn on the first transistor 108C to connect the third supply voltage V3 to the second transistor 110C. The complementary TV3_ output signal will be a positive voltage level that is a translation of the third voltage supply V3 (TV3). The positive output voltage level TV3_ signal will be applied to the gates 130A and 130B to inactivate or turn off the transistors 120A and 120B. The NN3 output signal will be a logic 1 or high in response to IN1 being a logic 1 and IN2 being a logic 1 and will cause the nch transistor 126C to be activated to ground the gate 114C and activate the second transistor 110C to connect the third supply voltage V3 to the output 104 of the switch 100. The TV1_, TV2_ and TV3 output signals of the control circuit 200 will all be ground. The TV3 and TV2_ ground signals will be applied to gates the 132A and 134A, respectively and the TV3 and TV1_ ground signals will be applied to the gates 132B and 134B, respectively, to activate the corresponding transistors so that the third voltage supply V3 is connected to the gates 114A and 114B of the transistors 110A and 110B to inactivate the transistors 110A and 110B to disconnect the first voltage supply V1 and the second voltage supply V2 from the output 104 of the switch 100. TV1 and TV2 will be high or positive voltage levels signals to inactivate transistors 108A and 108B to further insure that voltage supplies V1 and V2 are not connected to the switch output 104 when the third supply voltage V3 is connected to the output 104 of the switch 100.

As a result of the symmetrical design of the switch paths 102A–C and the input circuits 116A–C, additional voltage supplies can be multiplexed by simply adding additional switch paths 102 and input circuits 116. The control circuit 200 may be modified to accommodate the additional voltage supplies or the control of the switch 100 may be implemented in a software algorithm.

Figure 4A:
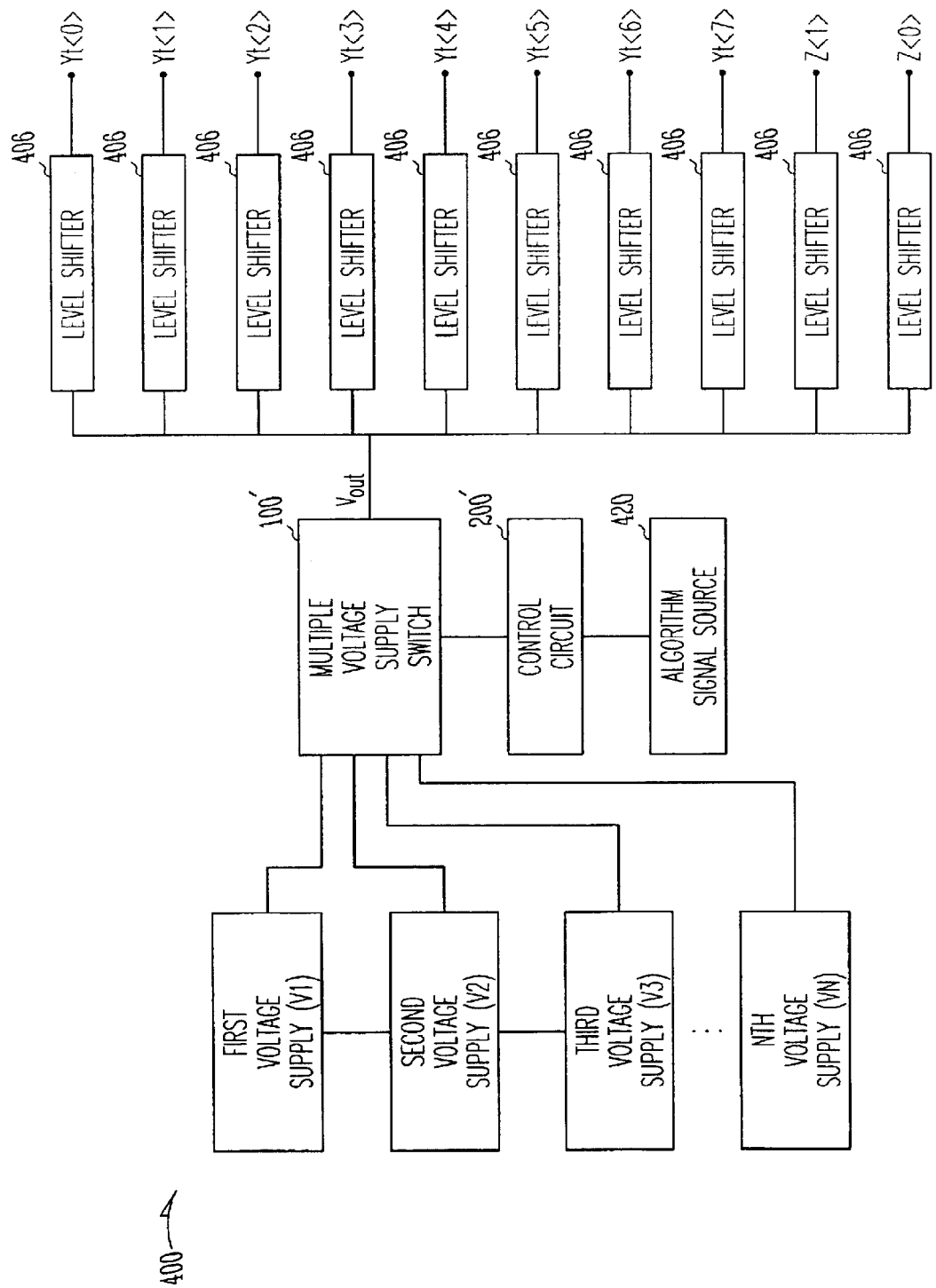
FIGS. 4A and 4B are a schematic diagram of a memory system utilizing the multiple voltage supply switch in accordance with the present invention.
Figure 4B:
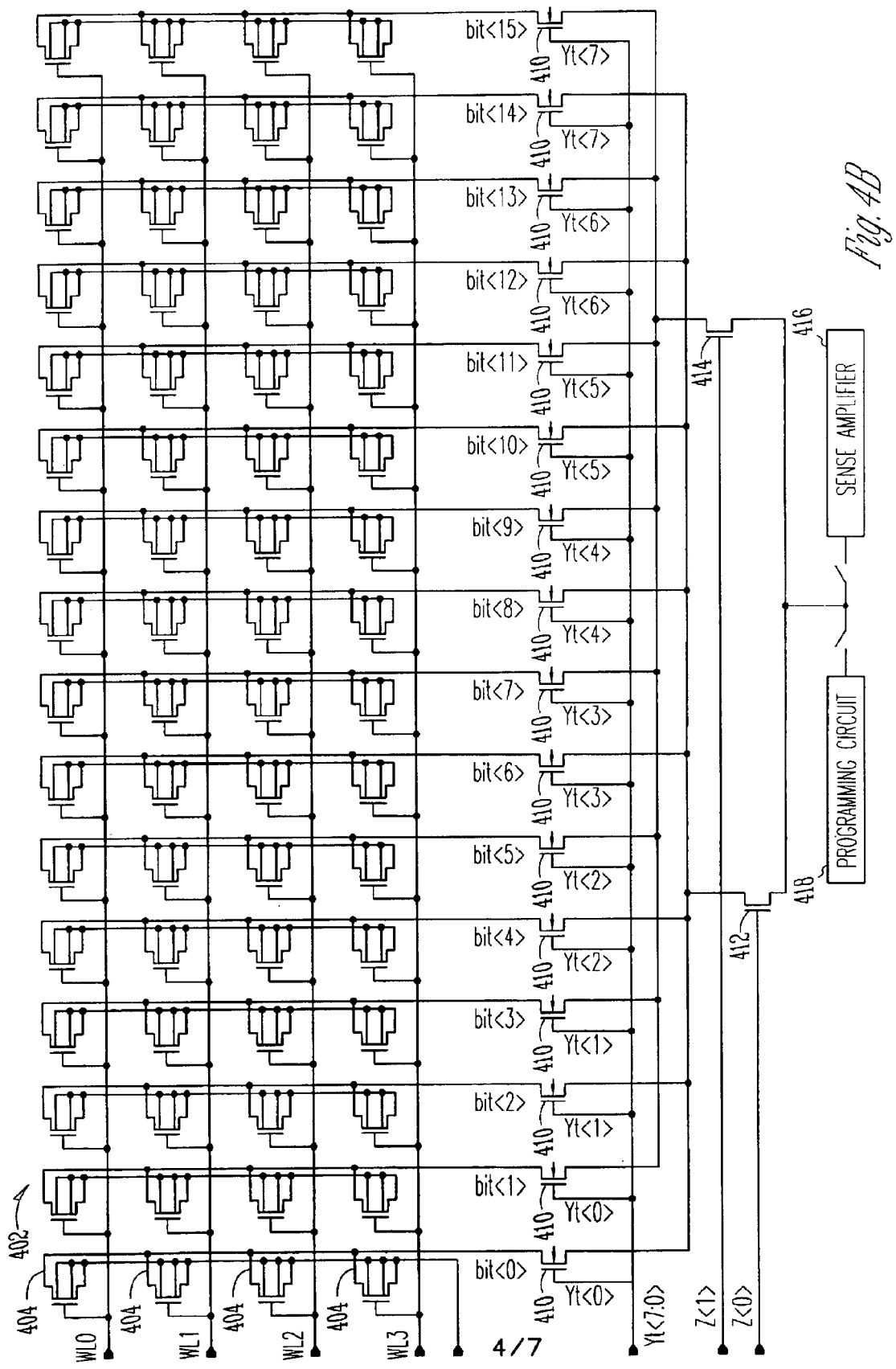

FIGS. 4A and 4B are a schematic diagram of an example of an electronic system 400, specifically a memory system, that utilizes a multiple voltage supply switch 100', such as the switch 100 of the present invention. The system 400 includes a plurality of voltage supplies V1-VN. The voltage supplies V1-VN are connected to the voltage multiplexer or multiple voltage supply switch 100'. The output Vout of the multiple voltage supply switch 100' is connected to an array 402 of memory devices or cells 404. The output Vout of the multiple voltage switch 100' may be connected to the to the array 402 by a plurality of voltage level shifters 406. The level shifters 406 may be needed to provide the proper voltage level to the memory cells 404 for carrying out the desired function or operation. The memory array 402 shown in FIG. 4B is a four wordline (WL0–WL3) by 16 column array of bits (0–15). Each bit being stored in a memory cell 404 which may be a field effect transistor (FET). Each of the 16 columns are decoded through two levels of passgates controlled by the ten outputs from the level shifters 406, eight Yt<7:0> outputs, a Z<1> and a Z<0> output. The eight outputs Yt<7:0> are connected to the gates of the first level of passgate transistors 410. Each of the eight Yt<7:0> outputs is connected to the gates of two of the sixteen passgate transistors 410 as shown in FIG. 4B. The eight Yt<7:0> lines are represented by a single line in FIG. 4B for purposes of simplicity. It should be noted that the output Yt<0> is connected to the gates of the first two passgate transistors 410, Yt<1> is connected to the gates of the next two passgate transistors 410 and so forth for each pair of the sixteen passgate transistors 410.

The outputs Z<0> and Z<1> are connected to the gates of the passgate transistors 412 and 414 respectively. One terminal of each passgate transistor 412 and 414 is connected alternatively to either a sense amplifier 416 or a programming circuit 418 depending upon the mode or function to be performed by the memory array 402. The other terminal of each passgate transistor 412 and 414 is connected respectively to one of the terminals of each pair of passgate transistors 410 gated by each the eight Yt<7:0> outputs. For example, one of the terminals of passgate 412 connects to a terminal of eight passgate transistors 410 gated by each of the outputs Yt<7:0> and one terminal of the passgate 414 connects to a terminal of the other eight passgate transistors 410 also gated by each of the outputs Yt<7:0> as shown in FIG. 4B.

In operation, the algorithm or signal source 420 will generate control signals IN1 and IN2 according to the mode or operation to be performed by the memory array 402. The signals IN1 and IN2 are received by the control circuit 200' and the control circuit 200' generates output signals (FIGS. 2 and 3) that control the operation of the multiple voltage switch 100' to select one of the switching paths or circuits 102 and connect a selected one of the voltage supplies, V1-VN, to the output, Vout, of the switch 100'. The selected output voltage is then passed through the level shifters 406 and applied to the passgate transistors 410, 412 and 414 of the memory array 402. The memory cells 404 of the memory array 402 will then perform a predetermined function or operation in response to the voltage level applied to the passgate transistors 410, 412 and 414. For example, assuming V1 is a high voltage, the memory cells 404 will be enabled or set to a programming mode and will be connected by the passgate transistors 412 and 414 to the programming circuit 418. V2 is another voltage level that places the memory cells 404 in an erase verify mode of operation and V3 is another voltage level that causes the memory cells to perform a normal read operation or function.

Figure 5:
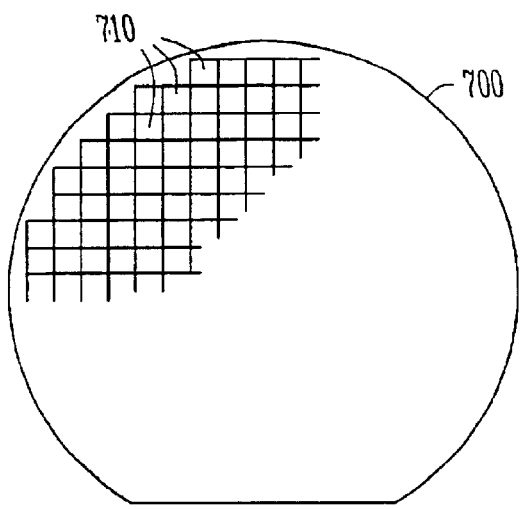
FIG. 5 is a top view of a wafer or substrate containing semiconductor dies in accordance with an embodiment of the present invention.

With reference to FIG. 5, in one embodiment, a semiconductor die 710 is produced from a silicon wafer 700. A die 710 is an individual pattern, typically rectangular, on a substrate that contains circuitry to perform a specific function. A semiconductor wafer 700 will typically contain a repeated pattern of such dies 710 containing the same functionality. Die 710 may contain circuitry for the inventive multiple voltage supply switch 100 and memory device 402 or other device with which the switch 100 may be utilized, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die 710 for unilateral or bilateral communication and control.

Figure 6:
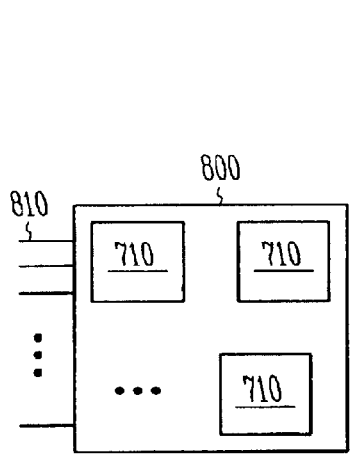
FIG. 6 is a block diagram of an exemplary circuit module in accordance with an embodiment of the present invention.

As shown in FIG. 6, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. Some examples of a circuit module include memory modules, device drivers, power modules, communication modems, processor modules and application-specific modules, multiple voltage supply switches 100 and control circuits 200 and may include multi-layer, multi-chip modules. Circuit module 800 may be a sub-component of a variety of electronic systems, such as a clock, a television, a cell phone, a personal computer, an automobile, an industrial control system, an aircraft and others. Circuit module 800 will have a variety of leads 810 extending therefrom providing unilateral or bilateral communication and control.

Figure 7:
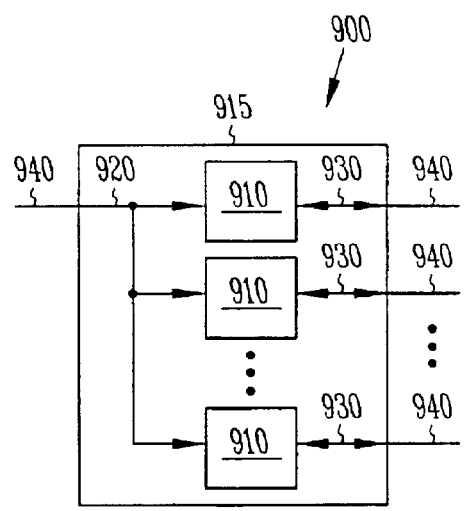
FIG. 7 is a block diagram of an exemplary memory module in accordance with an embodiment of the present invention.

FIG. 7 shows one embodiment of a circuit module as a memory module 900. Memory module 900 generally depicts a Single In-line Memory Module (SIMM) or Dual In-line Memory Module (DIAM). A SIMM or DIAM is generally a printed circuit board (PCB) or other support containing a series of memory devices. While a SIMM will have a single in-line set of contacts or leads, a DIAM will have a set of leads on each side of the support with each set representing separate I/O signals. Memory module 900 contains multiple memory devices 910 contained on support 915, the number depending upon the desired bus width and the desire for parity. Memory module 900 may contain memory devices 910 on both sides of support 915. Memory module 900 accepts a command signal from an external controller (not shown) on a command link 920 and provides for data input and data output on data links, 930. The command link 920 and data links 930 are connected to leads 940 extending from the support 915. Leads 940 are shown for conceptual purposes and are not limited to the positions shown in FIG. 7. The memory module 900 or memory devices 910 may also include the multiple voltage switch 100 and control circuit 200 to provide application of different voltages to the memory devices 910 to enable the memory devices to perform different functions or operations or to place the memory devices 910 in different modes as previously described.

Figure 8:
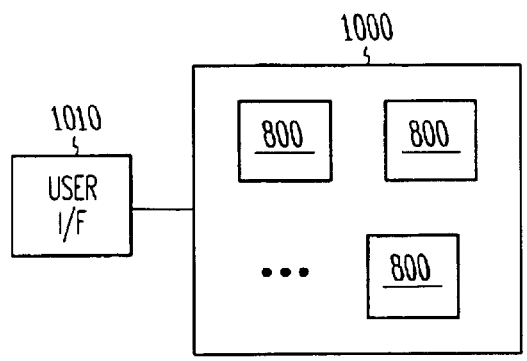
FIG. 8 is a block diagram of an exemplary electronic system in accordance with the present invention.

FIG. 8 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. One or more of the circuit modules 800 may also include a multiple voltage switch 100 and control circuit 200 to facilitate the application of different voltage levels to other components in the circuit module 800 or to other circuit modules 800 in the electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a sub-component of a larger electronic system.

Figure 9:
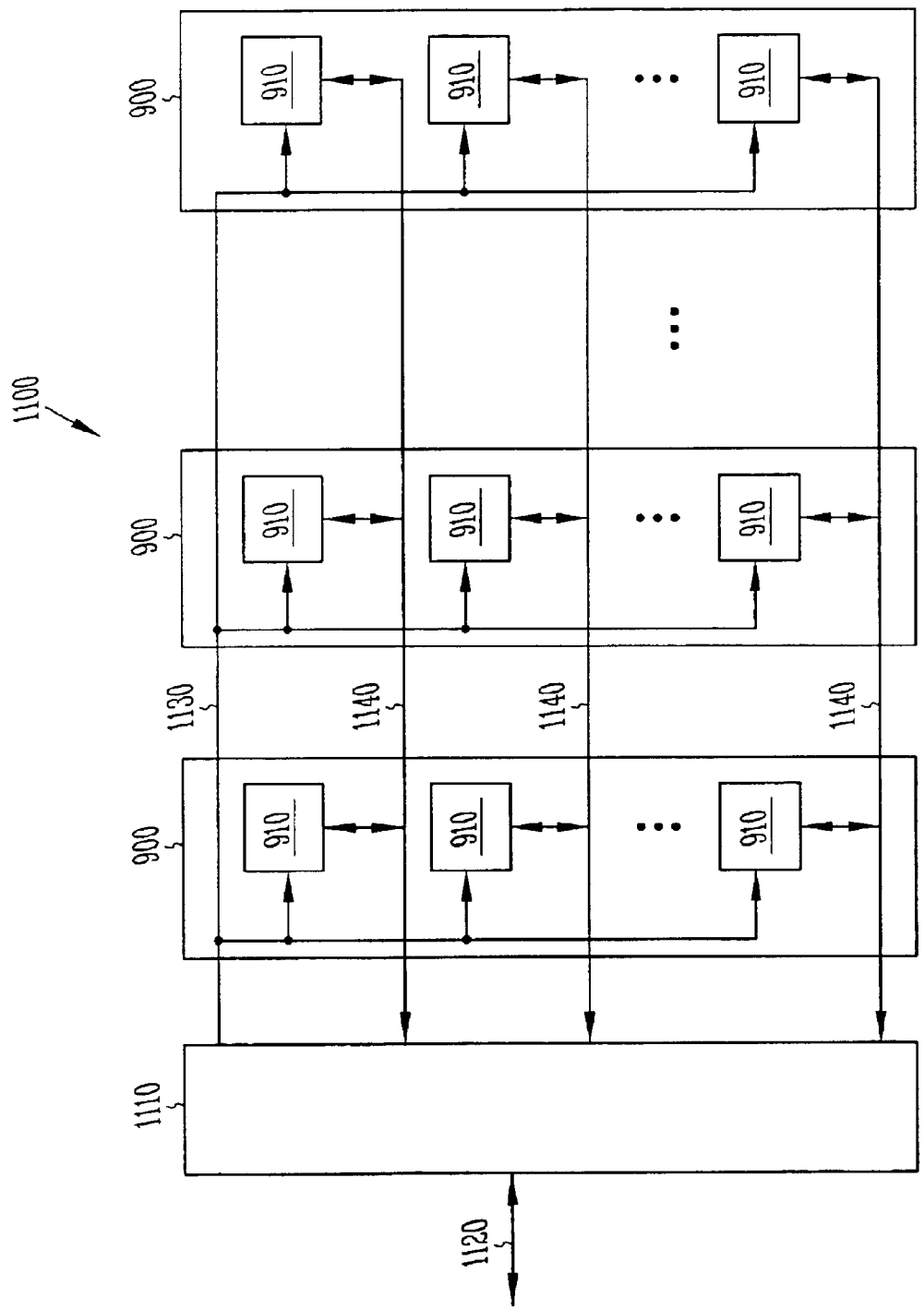
FIG. 9 is a block diagram of an exemplary memory system in accordance with the present invention.

FIG. 9 shows one embodiment of an electronic system as a memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 10:
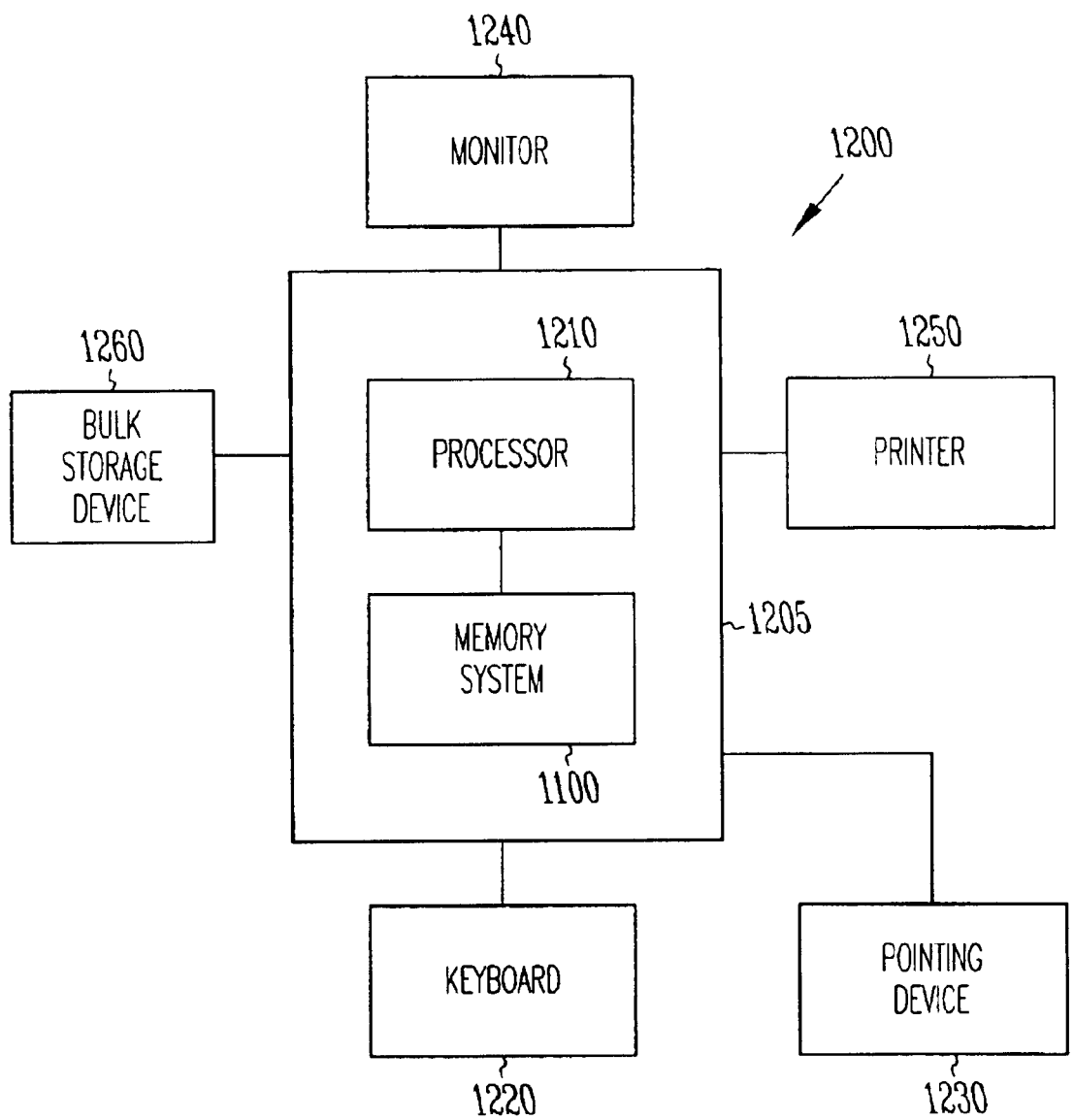
FIG. 10 is a block diagram of an exemplary computer system in accordance with the present invention.

FIG. 10 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e. memory system 1100, as a sub-component. Computer system 1200 optionally contains user interface components. Depicted in FIG. 10 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor 1210 and the memory system 1100.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A memory device, comprising:
   a multiple voltage supply switch; and
   a control circuit connected to the multiple voltage switch to select one of a plurality of voltage supplies to be connected to the memory device in response to a predetermined function to be performed by the memory device, the control circuit operable to generate select signals translated to the plurality of supply voltages.

2. A memory device, comprising:
   a multiple voltage supply switch including a switch path between each of a plurality of inputs, each input for connection to a different voltage supply, and an output of the switch connected to the memory device, each switch path including no more than two switching devices to minimize IR drop across the switch path; and
   a control circuit connected to the multiple voltage switch to select one of the switch paths to connect one of the voltage supplies to the memory device in response to a predetermined function to be performed by the memory device, the control circuit operable to generate select signals translated to the plurality of input voltages.

3. A memory device, comprising:
   an array of memory cells;
   a multiple voltage supply switch comprising:
      a first pair of switching devices including an input for connection to a first voltage supply and an output connected to an output of the multiple voltage supply switch;
      a second pair of switching devices including an input for connection to a second voltage supply and an output connected to an output of the multiple voltage supply switch;
      a third pair of switching devices including an input for connection to a third voltage supply and an output connected to an output of the multiple voltage supply switch; and a control circuit to activate one of the first, second or third pair of switching devices to apply an associated one of the first, second or third voltage supplies to at least a portion of the array of memory cells to enable the memory cells to perform a predetermined operation, the control circuit operable to generate activation signals translated to the first, second, or third supply voltages.

4. A memory device, comprising:

an array of memory cells;

a multiple voltage supply switch including:
   a plurality of switch paths, each switch path being connected between an associated one of a plurality of voltage supplies and an output of the multiple voltage supply switch, each switch path comprising:
      a first switching device connected to the associated one of the plurality of voltage supplies; and
      a second switching device connected between the first switching device and the output of the multiple voltage supply switch, wherein both the first and second switching devices are activated to connect the associated one of the voltage supplies to the output of the multiple voltage supply switch and wherein at least one of the first or the second switching devices of each of the other switch paths are inactivated to disconnect the voltage supply associated with the other switch paths from the output of the multiple voltage supply switch; and
   a control circuit to selectively activate the switching devices to connect one of the plurality of voltage supplies to at least a portion of the array of memory cells to enable the memory cells to perform a predetermined function, the control circuit operable to generate activation signals translated to the plurality of supply voltages.

5. An electronic system, comprising:

a processor;

a memory device, wherein the memory device performs different operations in response to different voltage levels applied to the memory device;

a multiple voltage supply switch to apply different voltages to the memory device, the multiple voltage supply switch comprising:
   a first switching device connectable to a first voltage supply;
   a second switching device connected between the first transistor and an output of the switch;
   a third switching device connectable to a second voltage supply;
   a fourth switching device connected between the third transistor and the output of the switch;
   a fifth switching device connectable to a third voltage supply; and
   a sixth switching connected between the fifth transistor and the output of the switch; and
   a control circuit to selectively activate the switching devices to connect one of the first, second or third voltage supplies to the output of the multiple voltage supply switch, the control circuit operable to generate activation signals translated to the first, second or third supply voltages.

6. An electronic system, comprising:

a processor;

a memory device, wherein the memory device performs different operations in response to different voltage levels applied to the memory device;

a multiple voltage supply switch to apply different voltages to the memory device, the multiple voltage supply switch comprising a plurality of inputs, each input for connection to one of a plurality of voltage supplies and the multiple voltage supply switch including a switch path between each of the plurality of inputs and an output of the multiple voltage supply switch and each switch path including no more than two switching devices to minimize an IR drop across the switch path; and a control circuit connected to the multiple voltage supply switch to select one of the switch paths to connect one of the voltage supplies to the memory device in response to a predetermined function to be performed by the memory device, the control circuit operable to generate select signals translated to the plurality of input voltages.

7. An electronic system, comprising:

a processor;

a memory device, wherein the memory device performs different operations in response to different voltage levels applied to the memory device;

a multiple voltage supply switch to apply different voltages to the memory device, the multiple voltage supply switch comprising:
   a plurality of switching paths, each switching path comprising:
      a first switching device for connection to an associated one of a plurality of voltage supplies;
      a second switching device connected between the first switching device and an output of the switch; and
      a control circuit to activate both the first and second switching devices to connect the associated one of the voltage supplies to the output of the switch and wherein at least one of the first or the second switching devices of each of the other switching paths are inactivated to disconnect the voltage supplies associated with each of the other switching paths from the output of the switch, the control circuit operable to generate activation signals translated to the plurality of supply voltages.

8. A method of operating a memory device, comprising:

providing a multiple voltage supply switch including a plurality of switch paths, each switch path having an input for connection to one of a plurality of voltage supplies;

selecting one of the plurality of switch paths to apply one of the plurality of voltage supplies to the memory device, wherein the memory device performs a predetermined operation in response to a voltage level applied;

generating select signals translated to the plurality of voltage supplies; and activating a first switching device and a second switching device to select the one of the plurality of switch paths, wherein at least one switching device is activated using a translated select signal.

9. A method of operating a memory device, comprising:

providing a multiple voltage supply switch including a plurality of switch paths, each switch path having an input for connection to one of a plurality of voltage supplies;

selecting one of the plurality of switch paths to apply one of the plurality of voltage supplies to the memory device, wherein the memory device performs a predetermined operation in response to a voltage level applied;

activating a first transistor and a second transistor to select the one of the plurality of switch paths;

inactivating at least one of a first transistor and a second transistor of each non-selected ones of the plurality of switch paths;

generating at least one signal to activate the first transistor and the second transistor of the selected switch path; and generating at least one other signal to inactivate the at least one of the first transistor and the second transistor of each non-selected ones of the plurality of switch paths, wherein generating the signals includes translating a voltage level of at least one select signal and non-select signal to the plurality of voltage supplies.

10. A method of making a memory device, comprising:

forming an array of memory cells;

forming a multiple voltage supply switch including a plurality of switch paths for connection between a plurality of voltage supplies and the array of memory cells, each of the switch paths including no more than two switching devices to minimize an IR drop across the switch path; and forming at least one control circuit to generate control signals translated to the plurality of voltage supplies to connect at least one of the plurality of supply voltages to the array of memory cells.

11. A method of making a memory device, comprising:

forming an array of memory cells;

forming a multiple voltage supply switch including a plurality of switch paths for connection between a plurality of voltage supplies and the array of memory cells, each of the switch paths including no more than two switching devices to minimize an IR drop across the switch path; and forming a control circuit to control operation of the multiple voltage supply switch, wherein the multiple voltage supply switch will apply a predetermined voltage level to the array of memory cells to cause the memory cells to perform a predetermined operation, wherein the control circuit generates select signals translated to the plurality of voltage supplies to apply the predetermined voltage level.

12. A method of making a memory device, comprising:

forming an array of memory cells;

forming a multiple voltage supply switch to apply different voltage levels to the array of memory cells to cause the memory cells to perform different operations, wherein forming the multiple voltage switch comprises:

forming a first transistor;

forming a second transistor connected between the first transistor and an output of the multiple voltage switch;

forming a third transistor;

forming a fourth transistor connected between the third transistor and the output of the multiple voltage switch;

forming a fifth transistor; and forming a sixth transistor connected between the fifth transistor and the output of the multiple voltage switch; and forming a control circuit to control operation of the multiple voltage supply switch, wherein the multiple voltage supply switch will apply a predetermined voltage level to the array of memory cells to cause the memory cells to perform a predetermined operation wherein the control circuit generates select signals translated to multiple voltage supplies to apply the predetermined voltage level.

13. A method of making an electronic system, comprising:

forming a processor;

forming a memory system coupled to the processor;

forming a multiple voltage supply switch to apply different voltage levels to the memory system to cause the memory system to perform different operations, wherein the multiple voltage switch includes a plurality of switch paths for connection between a plurality of voltage supplies and the memory system, each of the switch paths including no more than two switching devices to minimize an IR drop across the switch path; and forming at least one voltage translator circuits to generate select signals translated to the plurality of voltage supplies to connect at least one of the plurality of supply voltages to the array of memory cells.

14. A method of making an electronic system, comprising:

forming a processor;

forming a memory system coupled to the processor; and forming a multiple voltage supply switch for applying different voltage levels to the memory system to cause the memory system to perform different operations, wherein forming the multiple voltage switch comprises:

forming a first transistor;

forming a second transistor connected between the first transistor and an output of the multiple voltage switch;

forming a third transistor;

forming a fourth transistor connected between the third transistor and the output of the multiple voltage switch;

forming a fifth transistor;

forming a sixth transistor connected between the fifth transistor and the output of the multiple voltage switch; and forming at least one voltage translator circuit to generate select signals translated to multiple voltage supplies to connect at least one of the multiple voltage supplies to the array of memory cells.

* * * * *